(12) United States Patent
Watanabe et al.

(10) Patent No.: US 6,751,860 B2
(45) Date of Patent: Jun. 22, 2004

(54) METHOD OF MAKING OF ELECTRONIC PARTS MOUNTING BOARD

(75) Inventors: Yuichi Watanabe, Chiyoda-ku (JP); Hisashi Ohtsuki, Chiyoda-ku (JP)

(73) Assignee: The Furukawa Electric Co., Ltd., Tokyo (JP)

( * ) Notice: Subject to any disclaimer, the term of this patent is extended or adjusted under 35 U.S.C. 154(b) by 60 days.

(21) Appl. No.: 10/229,288

(22) Filed: Aug. 28, 2002

(65) Prior Publication Data

US 2003/0036295 A1 Feb. 20, 2003

Related U.S. Application Data

(63) Continuation-in-part of application No. 09/510,219, filed on Feb. 22, 2000.

(51) Int. Cl.[7] .................................................. H05K 3/00
(52) U.S. Cl. ............................... 29/842; 29/844; 29/845
(58) Field of Search .......................... 29/842, 844, 845, 29/876

(56) References Cited

U.S. PATENT DOCUMENTS

| | | | | |
|---|---|---|---|---|
| 2,613,252 A | | 10/1952 | Heibel | |
| 2,912,745 A | * | 11/1959 | Steigerwalt et al. | 29/849 |
| 2,912,746 A | * | 11/1959 | Oshry et al. | 29/849 |
| 2,912,747 A | * | 11/1959 | Oshry et al. | 29/849 |
| 2,912,748 A | * | 11/1959 | Gray | 29/849 |
| 2,955,361 A | * | 10/1960 | Brown | 434/2 |
| 3,750,278 A | * | 8/1973 | Baker et al. | 29/844 |
| 3,978,375 A | | 8/1976 | Fukui et al. | |
| 4,095,253 A | | 6/1978 | Yoshimura et al. | |
| 4,471,158 A | | 9/1984 | Roberts | |
| 4,486,945 A | | 12/1984 | Aigoo | |
| 4,677,526 A | | 6/1987 | Muehling | |
| 4,965,933 A | | 10/1990 | Mraz et al. | |
| 5,295,299 A | * | 3/1994 | Takahashi | 29/853 |
| 5,305,523 A | * | 4/1994 | Bross et al. | 29/832 |
| 5,446,626 A | | 8/1995 | Dittmann et al. | |

* cited by examiner

*Primary Examiner*—Carl J. Arbes
(74) *Attorney, Agent, or Firm*—Griffin & Szipl, PC

(57) ABSTRACT

The present invention provides a method of making an electronic parts mounting board, comprising the steps of:

punching a conductive sheet to form a circuit pattern portion and through-holes in which electronic parts are to be mounted by use of a progressive die device while at the same time partially folding said circuit pattern portion to form connection terminal portions by use of said same progressive die device; and molding an insulative resin over the whole opposite sides of said circuit pattern portion and the base ends of the terminal portions including the folded parts thereof to form an integral covering portion having openings for electrically connecting said circuit pattern portion to electronic parts to be mounted thereon.

4 Claims, 17 Drawing Sheets

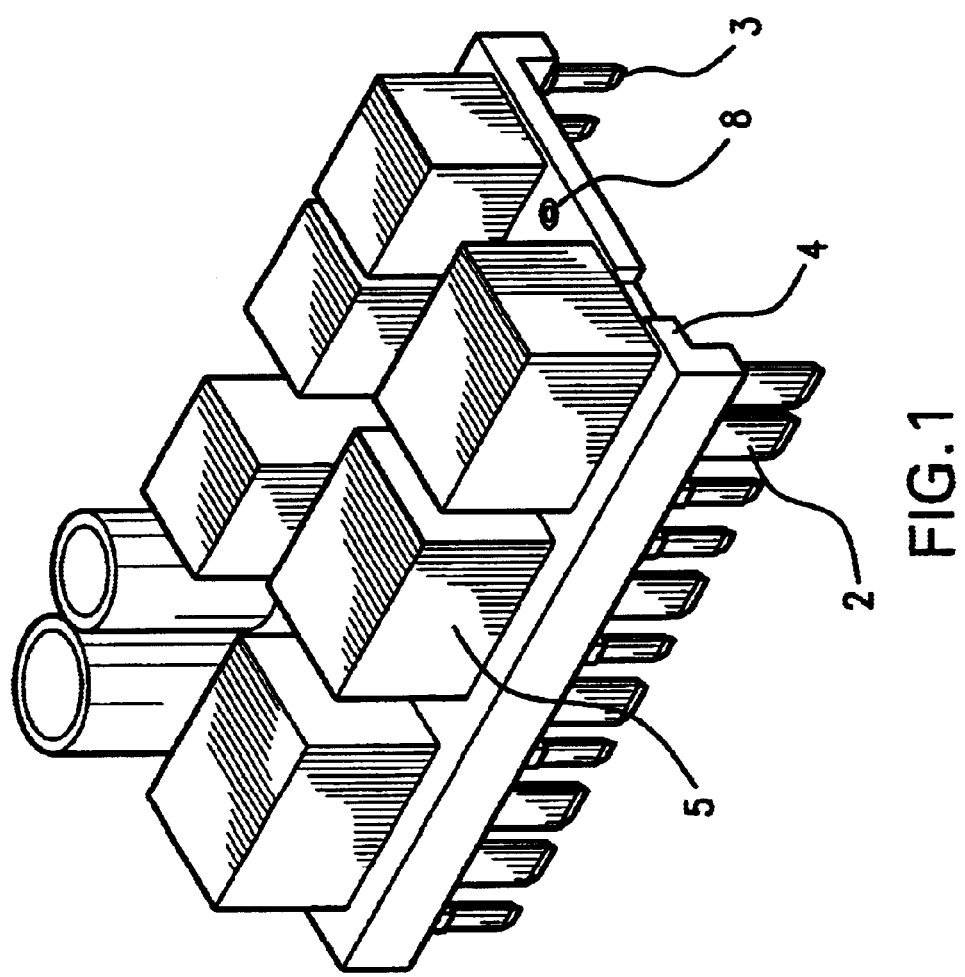

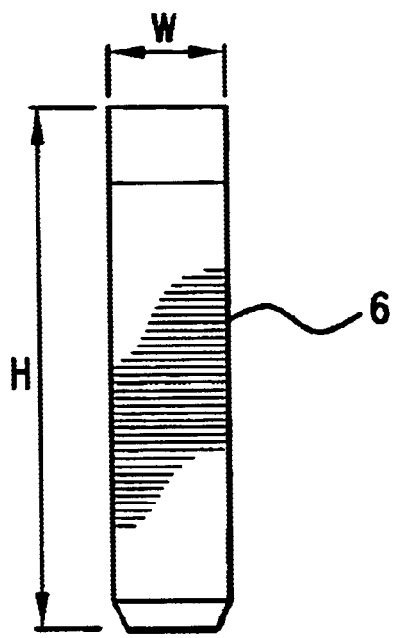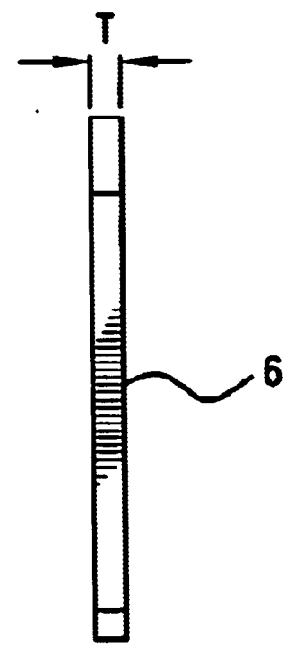
FIG.3(A)    FIG.3(B)
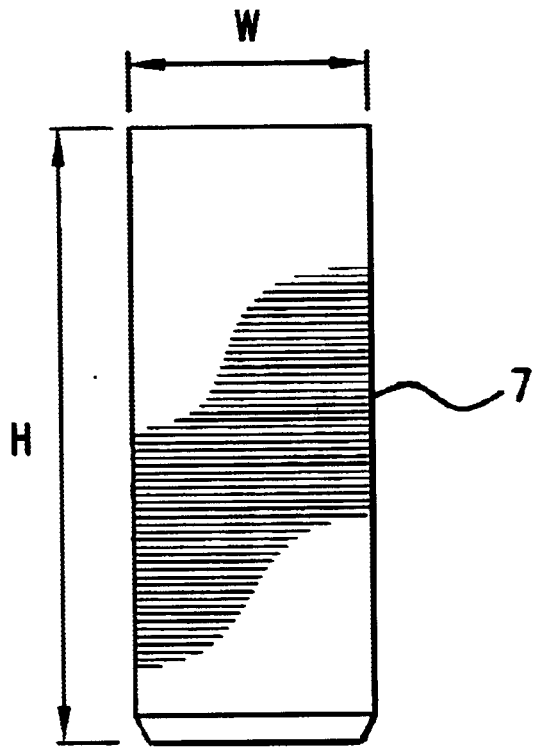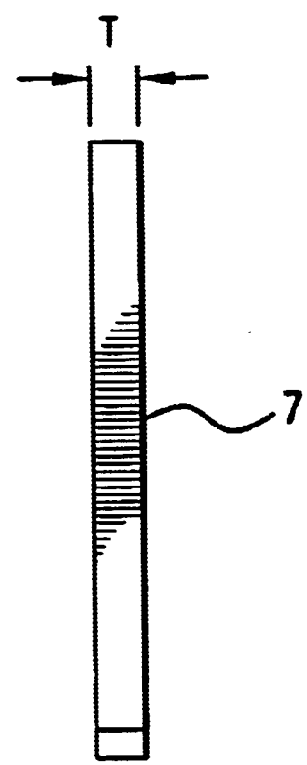
FIG.3(C)    FIG.3(D)

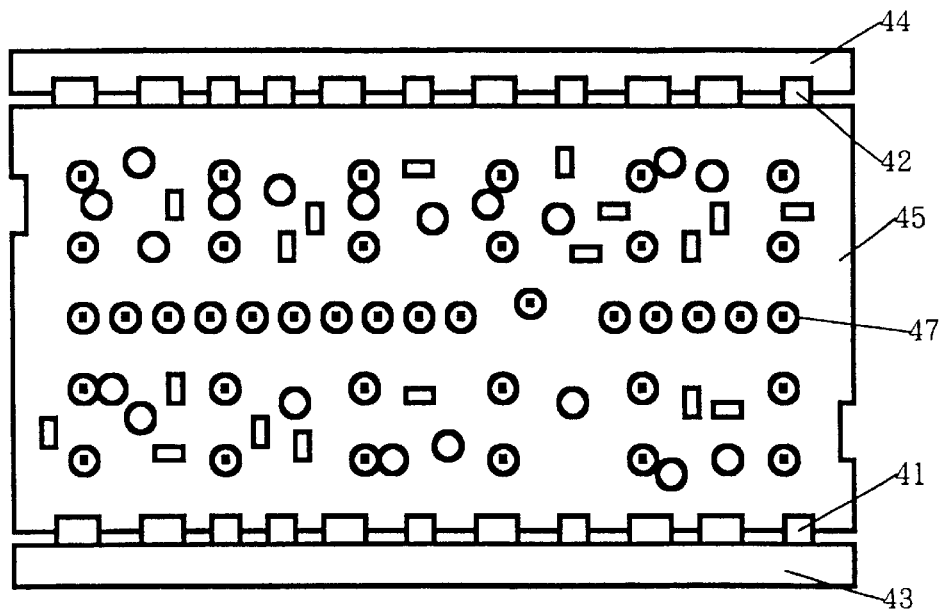
Fig.12 (A)  Prior Art
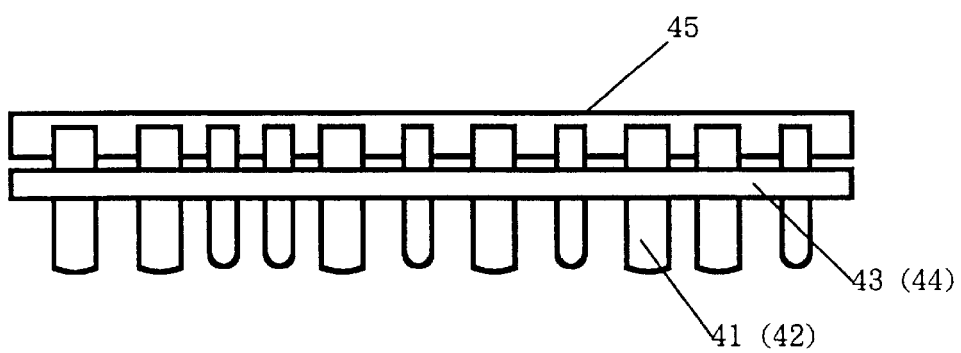
Fig.12 (B)  Prior Art
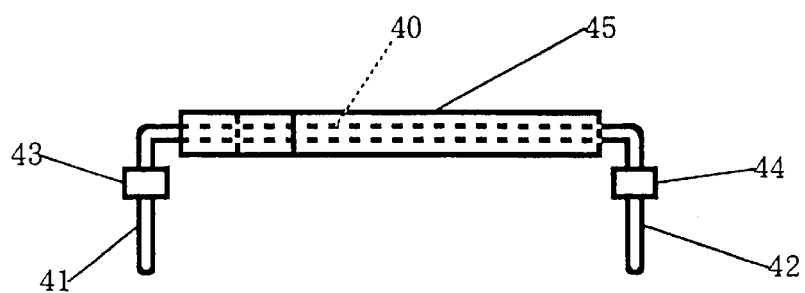
Fig.12 (C)  Prior Art

METHOD OF MAKING OF ELECTRONIC PARTS MOUNTING BOARD

This application is a continuation-in-part application of U.S. patent application Ser. No. 09/510,219 filed on Feb. 22, 2000, the entire disclosure of which is incorporated herewith by reference.

FIELD OF THE INVENTION

The present invention relates to a method of making of an electronic parts mounting board usable in electronic control equipment which may be used to control a heavy-current load such as motorcar headlight, window wiper, motor or the like.

BACKGROUND OF THE INVENTION

In the past, the electronic parts mounting boards used in such electronic heavy-current load equipment have been made by forming a thickened pattern on an epoxy resin-impregnated glass cloth for printed circuits board or by applying a pattern-cut brass, copper sheet on the epoxy resin-impregnated glass cloth for printed circuits board. However, such boards could not sufficiently be satisfied in reliability, cost, occupying area and other respects.

To improve the boards with respect to these respects, it has been proposed to coat a circuit pattern on an electronic parts mounting board with an insulation resin.

FIG. 11 of the accompanying drawings is a perspective view of an electronic parts mounting board according to the prior art, on which electronic parts have been mounted while FIGS. 12A, B and C are respectively plan view, side view and front view which illustrate the electronic parts mounting board of FIG. 11 having no electronic parts mounted thereon.

Referring to FIGS. 11 and 12, the electronic parts mounting board according to the prior art comprises a circuit pattern portion 40 formed by punching a conductive sheet of metal such as brass or the like (see FIG. 12C), first and second male terminal portions 41, 42 formed by turning the opposite sides of the circuit pattern portion 40 down at right angle, a first covering portion 43 of insulation resin covering the middles of the first male terminal portions 41, a second covering portion 44 of insulation resin covering the middles of the second male terminal portion 42, and a third covering portion 45 of insulation resin covering the whole top and bottom of the circuit pattern portion 40.

The first and second male terminal portions 41, 42 are used as connectors for power lines, load devices and other electronic control devices.

The first and second covering portions 43, 44 are provided to maintain the alignment correction and terminal strength in the respective first and second male terminal portions 41, 42.

The third covering portion 45 is formed with a plurality of openings 47 for electrically connecting relay parts or electronic parts 46 to be mounted such as hybrid boards and so on to the circuit pattern portion 40, for example (see FIG. 12A).

The electronic parts mounting board of the prior art may be manufactured by the following process: First, a conductive sheet is punched out by a press die to provide a desired circuit pattern portion 40. At the same time, various electronic parts mounting through-holes, first male terminal portion 41 and second male terminal portion 42 are formed in the circuit pattern portion 40. The circuit pattern portion 40 includes bridge portions for connecting all the circuits together.

Second, the punched intermediate product is set in an insert mold. A molten insulation resin is then injected into the mold cavity to form first, second and third covering portions 43, 44 and 45 on the middles of the first and second male terminal portions 41, 44 and the opposite faces of the circuit pattern portion 40, respectively.

Third, the bridge portions connecting the circuits together in the circuit pattern portion 40 are severed, if necessary.

Finally, a bending die is used to turn the first and second male terminal portions 41, 42 down at right angle. In such a manner, the complete electronic parts mounting board is formed.

However, the electronic parts mounting board according to the prior art has the following problems.

(1) Since the turned parts of the first and second male terminal portions 41, 42 are not covered with the resin, the electronic parts mounting area is reduced. Where many electronic parts 46 are to be mounted on the board, the mounting area must be increased. This increases the board in size.

(2) Since the turned parts of the first and second male terminal portions 41, 42 are not covered with the resin, any leakage may be created due to adhesion of water or the like. In fact, the turned parts have been coated with any suitable anti-leakage material. However, such a coating was difficult. The coating material may drop onto the circuit pattern portion 40, leading to contact failure.

(3) Three covering portions require a mold having at least three gates for injecting the resin material on formation of these three covering portions. This increases the mold manufacturing cost.

(4) The first and second male terminal portions 41, 42 were bent or turned after the resin molding step. This increases the number of steps for manufacturing the electronic parts mounting board and also requires an exclusive bending die. This also increases the mold manufacturing cost.

SUMMARY OF THE INVENTION

It is therefore an object of the present invention to provide a method of making an electronic parts mounting board which can have an increased electronic parts mounting area, be reduced in size, be prevented from creating the leakage and be manufactured inexpensively.

Another object of the present invention is to provide a method of making an electronic parts mounting board which can be reduced in manufacturing steps to decrease the manufacturing cost.

The present invention provides a method of making an electronic parts mounting board, comprising the steps of:

stamping a conductive sheet to form a circuit pattern portion and through-holes in which electronic parts are to be mounted by use of a progressive die device while at the same time partially folding said circuit pattern portion to form connection terminal portions by use of said same progressive die device; and molding an insulative resin over the whole opposite sides of said circuit pattern portion and the base ends of the terminal portions including the folded parts thereof to form an integral covering portion having openings for electrically connecting said circuit pattern portion to electronic parts to be mounted thereon.

BRIEF DESCRIPTION OF THE DRAWINGS

FIG. 1 is a perspective view of an electronic parts mounting board constructed according to the present invention, on which electronic parts are mounted.

FIGS. 3A–D are views for illustrating a male terminal portion.

FIGS. 12A–C are plan, side and front views for illustrating the electronic parts mounting board of the prior art on which no electronic part is mounted.

DESCRIPTION OF THE PREFERRED EMBODIMENTS

Figure 2A:
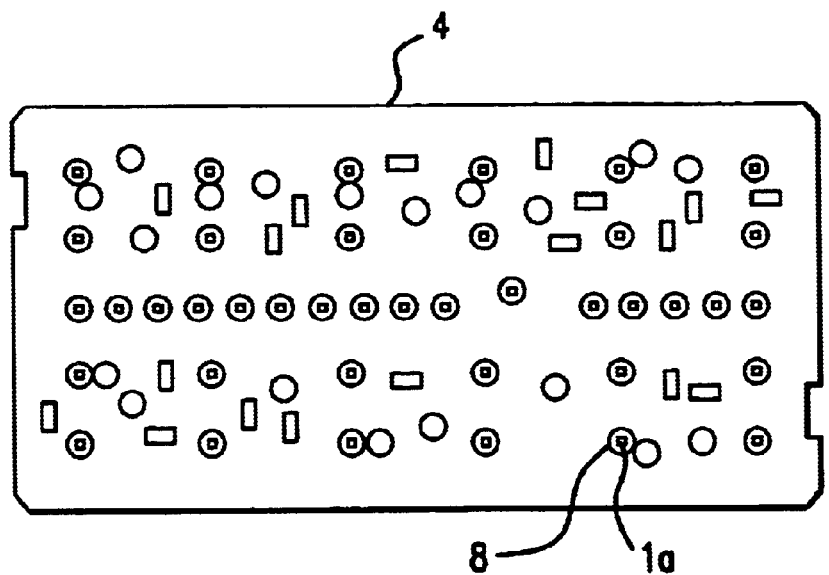
FIGS. 2A, B and C are plan, side and front views showing the electronic parts mounting board of the present invention on which no electronic part is mounted.
Figure 4:
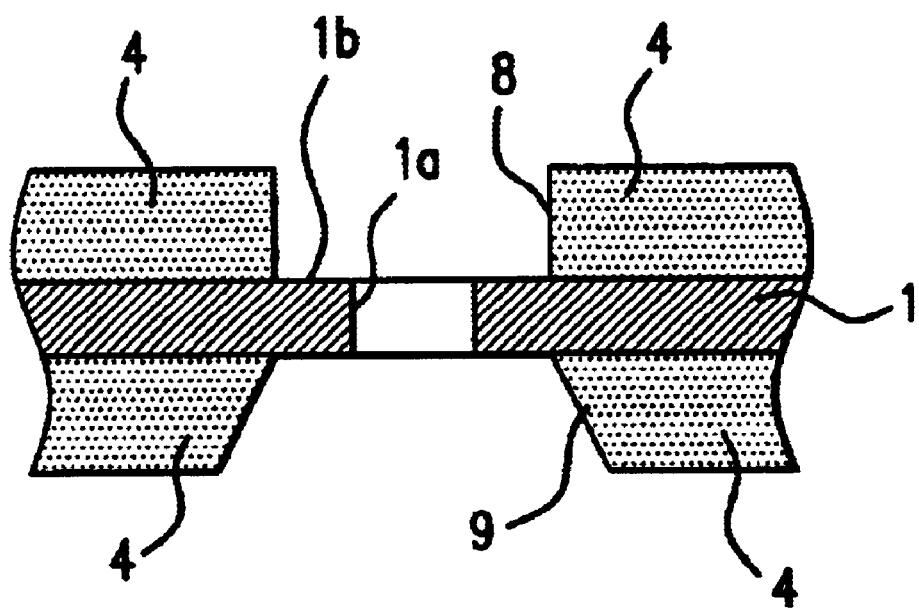
FIG. 4 is a fragmentary cross-section of the electronic parts mounting board for illustrating an opening formed through the covering portion.
Figure 5:
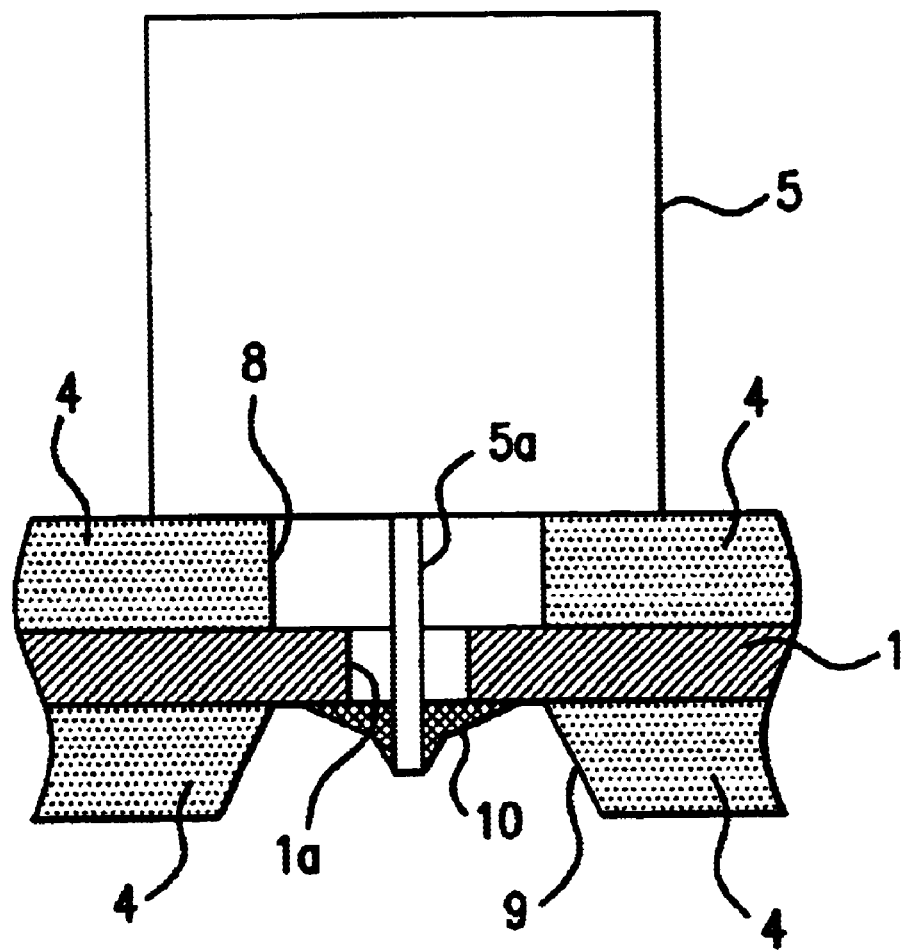
FIG. 5 is a fragmentary cross-section of the electronic parts mounting board for illustrating an electronic part mounted thereon.

Several preferred embodiments of the present invention will now be described with reference to FIGS. 1–10. FIG. 1 is a perspective view of an electronic parts mounting board constructed according to the present invention, on which electronic parts are mounted; FIGS. 2A, B and C are plan, side and front views showing the electronic parts mounting board of the present invention on which no electronic part is mounted; FIGS. 3A–D are views for illustrating a male terminal portion; FIG. 4 is a fragmentary cross-section of the electronic parts mounting board for illustrating an opening formed through the covering portion; and FIG. 5 is a fragmentary cross-section of the electronic parts mounting board for illustrating an electronic part mounted thereon.

Figure 2B:
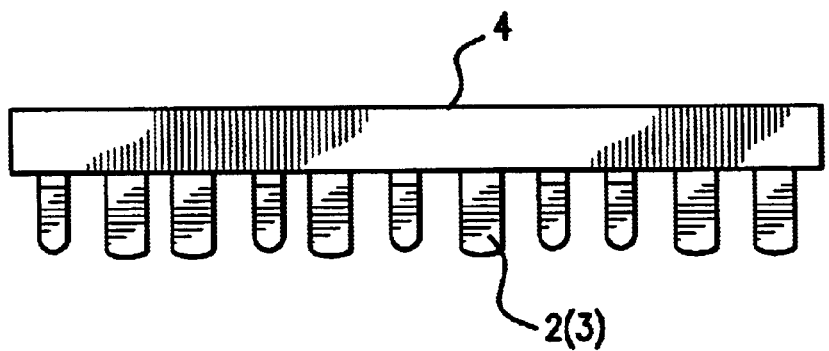
Figure 2C:
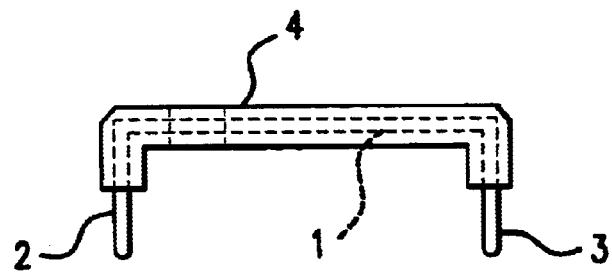

Referring to FIGS. 1 and 2, an electronic parts mounting board constructed according to the present invention is formed into a generally inverted C-shaped configuration and comprises a circuit pattern portion 1 of generally rectangular configuration which is formed by punching a conductive sheet (see FIG. 2C), a plurality of first and second male terminal portions 2, 3 formed by bending or tuning the opposite sides of the circuit pattern portion 1 at right angle, and an integral covering portion 4 of insulation resin formed to cover the whole circuit pattern portion 1 and the base ends of the first and second male terminal portions 2, 3.

The circuit pattern portion 1 has a pattern corresponding to the circuit pattern of a printed circuit board which may be made from the epoxy resin-impregnated glass substrate, for example. The pattern on the circuit pattern portion 1 is designed to have a desired function when various electronic parts 5 are mounted thereon. The circuit pattern portion 1 includes through-holes and lands 1a, 1b at locations in which the respective electronic parts 5 are to be mounted. Thus, the electronic parts 5 can be soldered onto the circuit pattern portion 1. For example, the circuit pattern portion 1 is formed by a 7:3 brass sheet of 0.8 mm thick and preferably tinned to improve the soldering property.

The first and second male terminal portions 2, 3 are formed to have their sizes depending on the load current. For example, with the load current of 5A class, such a male terminal portion 6 of 090 size as shown in FIGS. 3A and B may be used. The dimensions of such a male terminal portion 6 are of 2.3 mm wide, 0.64 mm thick and 10.8 mm high. With the load current of 10A class, such a male terminal portion 7 of 187 size as shown in FIGS. 3C and D may be used. The dimensions of such a male terminal portion 7 are of 4.8 mm wide, 0.8 mm thick and 11.6 mm high.

If the circuit pattern portion 1 is formed by the 7:3 brass sheet having its thickness of 0.8 mm, it is required to flatten the brass sheet for obtaining the male terminal portion 6 of 090 size. In other words, the flattening must be carried out to reduce the thickness of the brass sheet from 0.8 mm to 0.64 mm.

The first and second male terminal portions 2, 3 are also formed by the same tinned 7:3 brass sheet as in the circuit pattern portion 1.

The covering portion 4 is formed to cover the top and bottom faces of the circuit pattern and first and second male terminal portions 2, 3. As shown in FIG. 4, the top side of the covering portion 4 on which the electronic parts 5 are to be mounted is formed with first openings 8 at locations corresponding to the through-holes and lands 1a, 1b in the circuit pattern portion 1. The bottom side of the covering portion 4 includes second outwardly flared openings 9 formed therethrough. The covering portion 4 serves to fix the circuit pattern portion 1, to isolate the circuits in the circuit pattern portion 1 from one another and to fix and reinforce the first and second male terminal portions 2, 3. As will be described, furthermore, the bottom side of the covering portion 4 functions as means for preventing a molten soldering material from unnecessarily flowing out.

The insulation resin used to form the covering portion 4 is selected in view of the heat-resistance and heat-shrinkage after the molding step, that is, from the viewpoint of acceptable dimensional accuracy. If higher heat-resistance and dimensional accuracy are required, the covering portion 4 may be formed of PPS (polyphenylene sulfide) or the like. If only the heat-resistance is required, the covering portion 4 may be made of PBT (polybutylene terphthalate), nylon or the like. The resin thickness in the covering portion 4 is preferably made as thinly as possible and may be of about 1.1 mm, for example.

When a certain electronic parts 5 is to mounted on the electronic parts mounting board of the present invention, as shown in FIG. 5, the electronic part 5 is first placed at the corresponding first opening 8 in the covering portion 4. Lead 5a in the electronic part 5 is then inserted into the first opening 8 and into the through-hole 1a of the circuit pattern portion 1. The end of the electronic part 5 positioned in the second opening 9 is soldered to the circuit pattern portion 1. The soldering may automatically be controlled by the use of a robot hand having a soldering iron attached thereto at the tip end, for example. At this time, the side wall of the second opening 9 serves as a barrier for preventing the molten soldering material 10 from unnecessarily flowing out and can improve the shape of fillet.

In the electronic parts mounting board of the present invention, the covering portion 4 integrally covers the whole circuit pattern portion 1 and the base ends of the first and second male terminal portions 2, 3. Therefore, there are improved the fixation of the male terminal portions 2 and 3, the correction of alignment between the male terminal portions 2 and 3 and the reinforcement of the male terminal portions 2 and 3.

Since the covering portion 4 also covers the turned or bent parts of the male terminal portions 2 and 3, any leakage due to adhesion of water and the like can be prevented. As a result, the electronic parts mounting board can be improved in reliability.

When the turned parts of the male terminal portions 2 and 3 are covered with the covering portion 4, furthermore, the whole area of the circuit pattern portion 1 can be used as area usable for mounting the electronic parts 5. This increases the number of electronic parts to be mounted and also decreases the board in size, leading to a reduced manufacturing cost for the electronic parts mounting board.

A method of making the electronic parts mounting board according to the present invention will now be described.

Figure 6:
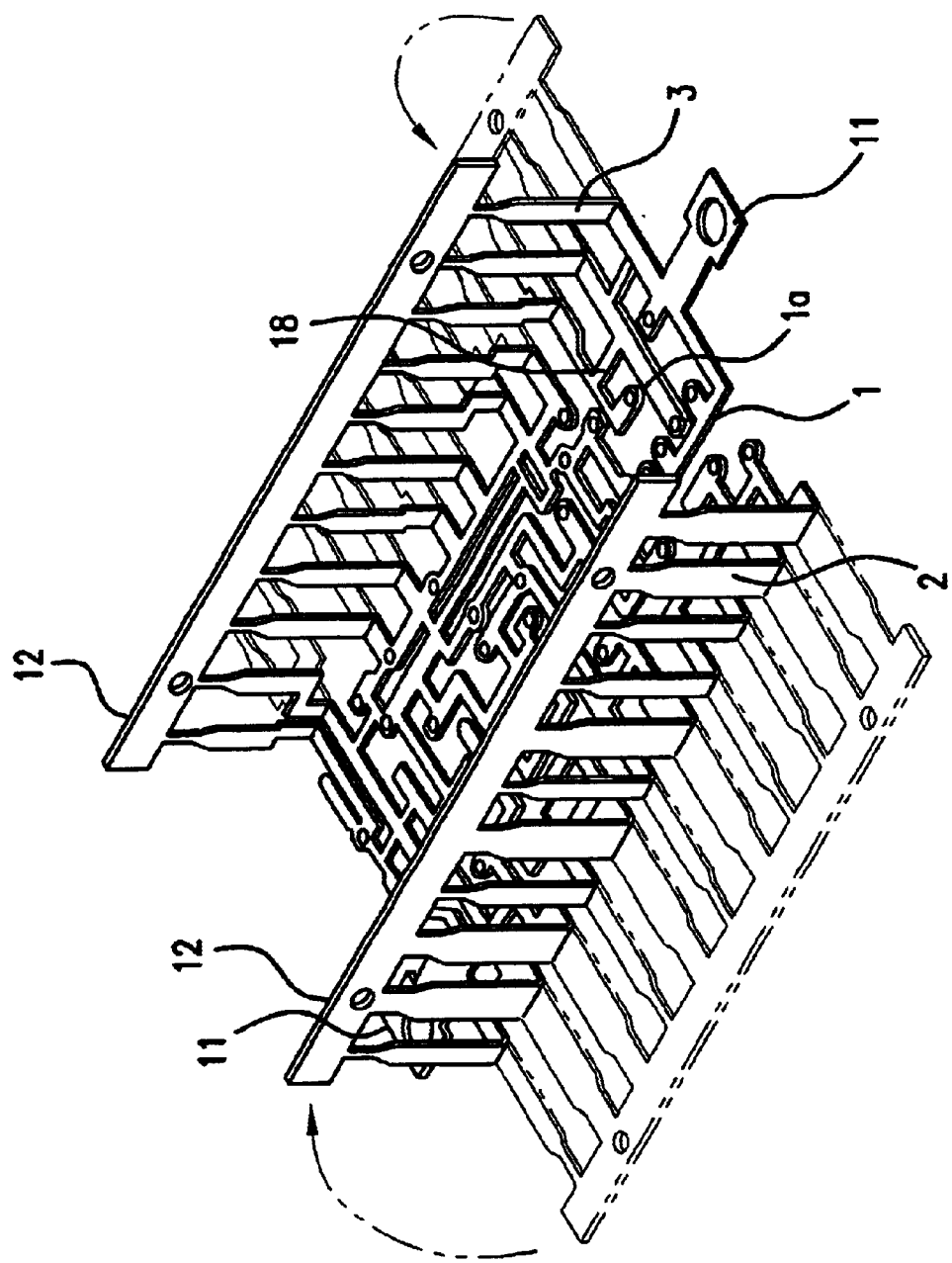
FIG. 6 is a perspective view of the electronic parts mounting board for bending parts of the circuit pattern portion punched from a conductive sheet to form male terminal portions.

First of all, an electrically conductive sheet 21 (e.g., brass sheet) is pressed to punch a desired circuit pattern 1, as shown in FIG. 6. At the same time, through-holes 1a for mounting various electronic parts are punched out with first and second male terminal portions 2, 3. Moreover, the first and second male terminal portions 2, 3 are folded through 90 degrees to provide an intermediate product of inverted C-shaped cross-section.

In the above step, a progressive die 22 as shown in FIGS. 13A–C is used. The progressive die 22 is disposed within a pressing machine 23 and designed to punch the longitudinally elongated conductive sheet 21 inserted thereinto through the open left end of the die in a sequential manner to form a circuit pattern. The progressive die 22 comprises a pair of die sections, that is, a stationary die section 22a and a vertically movable die section 22b.

Figure 13:
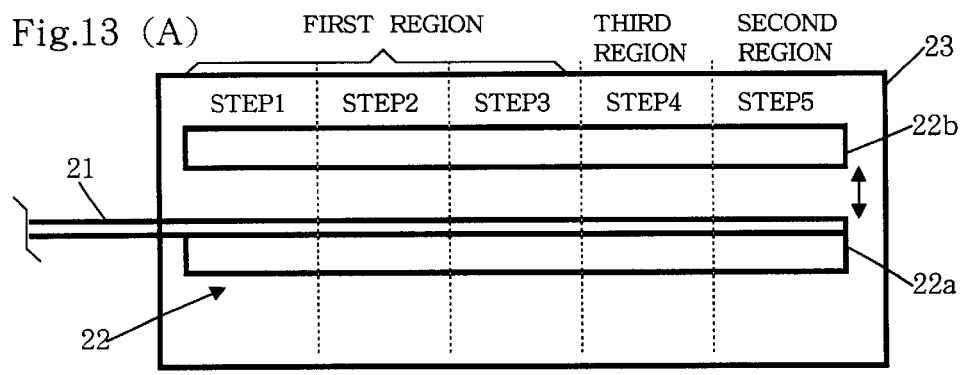
FIGS. 13A–C illustrate a process of making an electronic parts mounting board according to the present invention.
Figure 13:
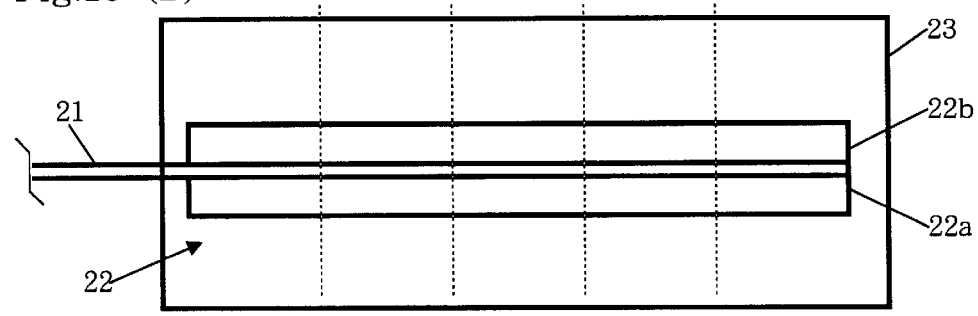
Figure 13:
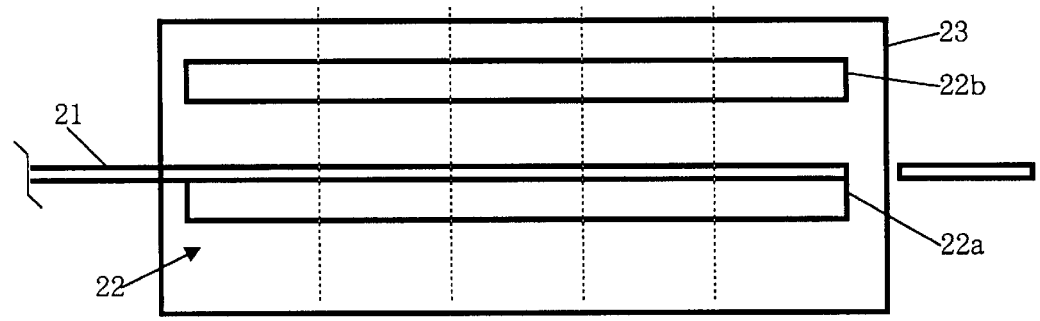

As shown in FIG. 13, the pressing machine 23 includes at least two longitudinally spaced working regions, that is, a first region (steps 1 to 3) for punching the conductive sheet 21 to form the circuit pattern 1 and through-holes 1a for mounting the electronic parts and a second region (step 5) for bending part of the circuit pattern 1 to form the male terminal portions 2 and 3. The pressing machine 23 may also include a third working region (step 4) between the first and second regions for swaging the male terminal portions 2 and 3 formed at the second region into a desired thickness.

When the conductive sheet 21 is stopped and if the movable die section 22b is actuated, the conductive sheet 21 is punched at the first regions to form the circuit pattern 1 and through-holes 1a. At the same time, part of the circuit pattern 1 is folded at the second region to form the male terminal portions 2 and 3 while the male terminal portions 2 and 3 are swaged at the third region.

If it is wanted to delivery the conductive sheet 21 through the open right end of the die, the movable die section 22b is upward retracted and stopped.

In such a manner, desired intermediate products will sequentially be formed while intermittently stopping and delivering the conductive sheet 21.

Figure 14:
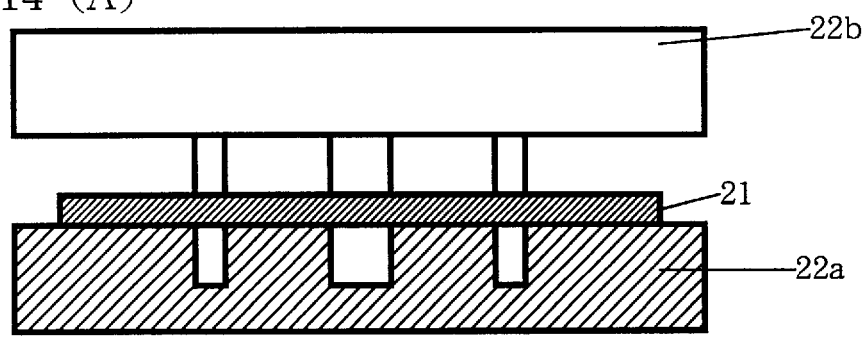
FIGS. 14A and B illustrate a step of punching an electrically conductive sheet.
Figure 14:
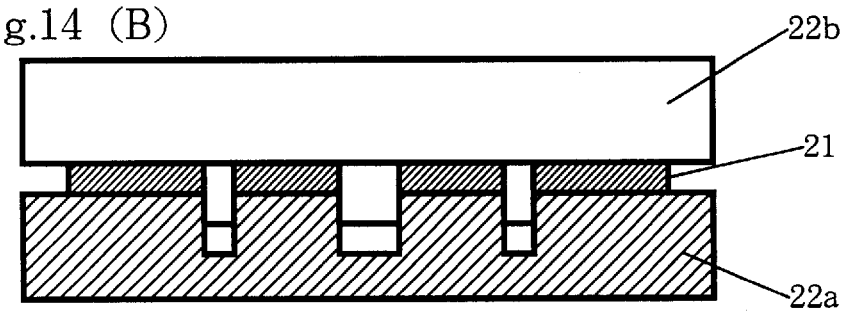
Figure 15:
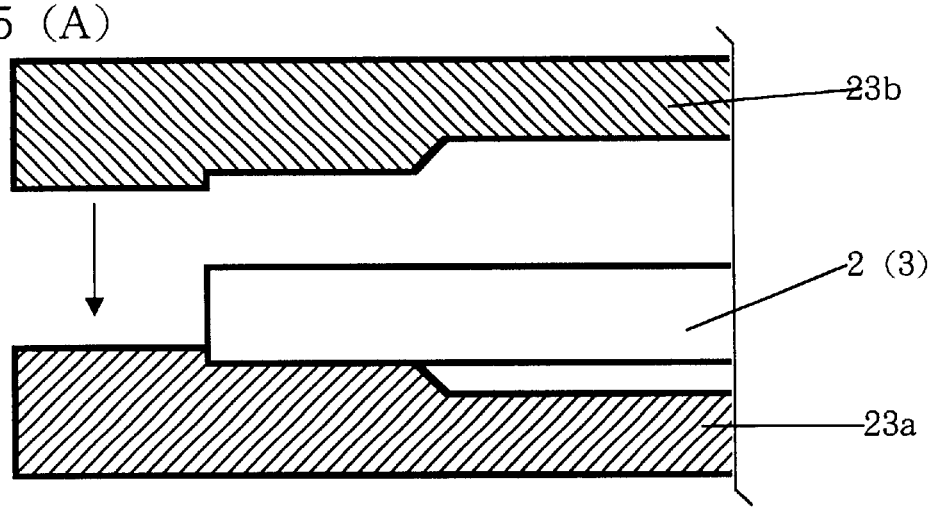
FIGS. 15A and B illustrate a step of swaging a connecting terminal.
Figure 15:
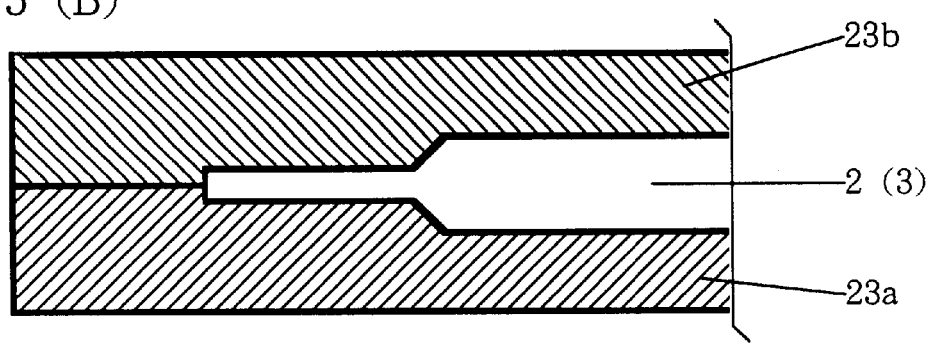

For example, in the first region and at the step 1, the through-holes 1a for mounting the electronic parts are punched out. In other words, the conductive sheet 21 is punched by moving the movable die section 22b toward the stationary die section 22a, as shown in FIGS. 14A and B.

In the first region and at the steps 2 and 3, the conductive sheet 21 is sequentially punched to form the circuit patterns 1 and to remove any unnecessary sheet parts.

In the third region and at the step 4, the male terminal portions 2 and 3 are swaged into the desired configuration. In other words, the male terminal portions 2 and 3 are swaged by moving the movable die section 22b toward the stationary die section 22a, as shown in FIGS. A and B.

Figure 16:
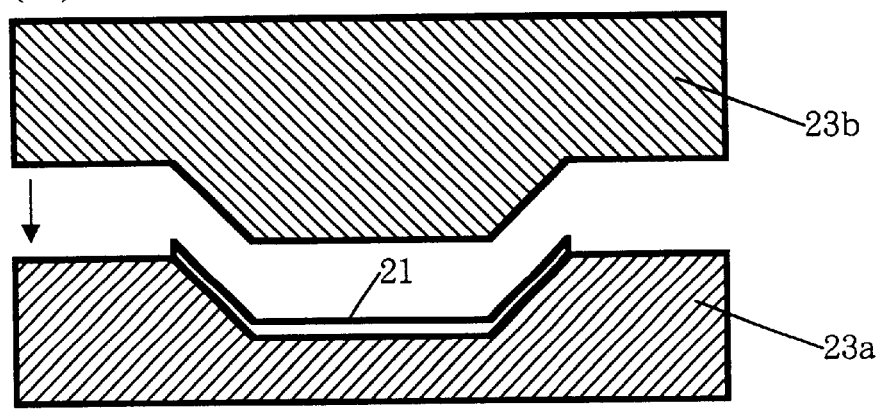
FIGS. 16A and B illustrate steps of bending a connecting terminal.
Figure 16:
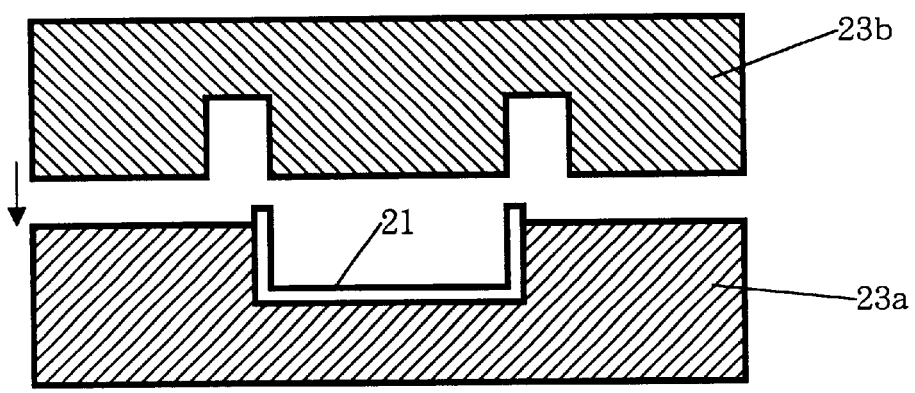

In the second region and at the step 5, the male terminal portions 2 and 3 are folded against the circuit patterns 1 through 90 degrees. In other words, the male terminal portions 2 and 3 are bent by moving the movable die section 22b toward the stationary die section 22a, as shown in FIGS. 16A and B. In the mass production, the bending process is carried out through two working steps (FIGS. 16A and B).

In the final step 5, individual intermediate products are separated from the conductive sheet 21 (see FIG. 13C).

In the prior art, the bending step was carried out by the pressing machine after the desired circuits have been completed by the pressing machine. On the contrary, the method of the present invention performs the bending step before the desired circuit is completed. In other words, one and the same die is used to the swaging and bending steps while punching the circuit patterns out. Thus, any bending die is not required, therefore reducing the cost relating to the die. Since the punching step of circuit pattern is carried out while performing the swaging and bending steps, the number of working steps and thus the manufacturing cost can be reduced.

In the circuit pattern 1, all the circuit parts are connected together by bridges 18.

Figure 17:
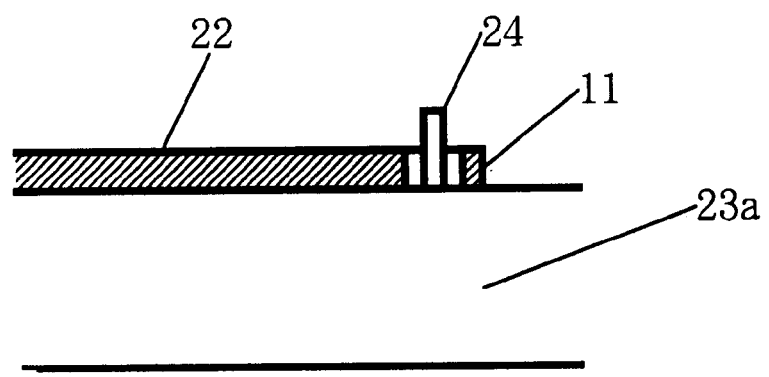
FIGS. 17 illustrates the positional adjustment of an electrically conductive sheet using an extension.

The circuit pattern 1 includes extensions 11 used to position it relative to the progressing die 22. When the conductive sheet 21 is to be pressed by the progressive die 22, the extensions 11 are used to position the conductive sheet 21 at a reference position. As shown in FIG. 17, for example, a projection 24 extending from the stationary die section 22a is inserted into a hole in each of the extensions 11 to position the conductive sheet 21.

The outer ends of the first and second male terminal portions 2, 3 are connected together by support portions 12 for aligning them in the longitudinal direction.

Figure 7:
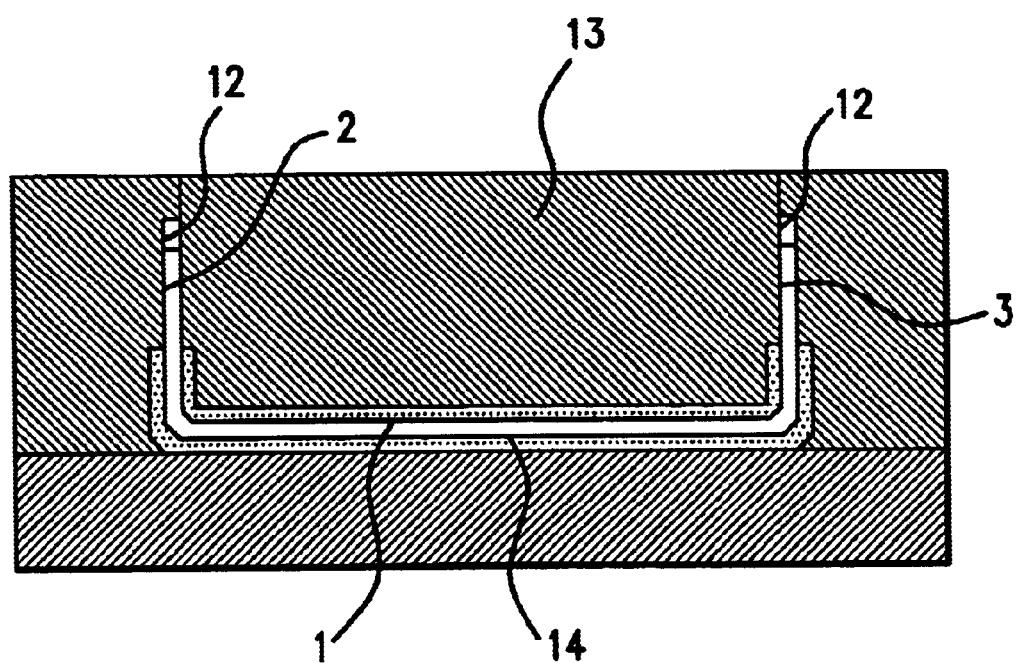
FIG. 7 is a cross-section of a mold usable for forming the covering portion.

The intermediate product shown in FIG. 6 is then set in an insert mold 13 shown in FIG. 7. An insulation resin 14 is then injected into the cavity of the mold 13 to form a covering portion 4.

Figure 8A:
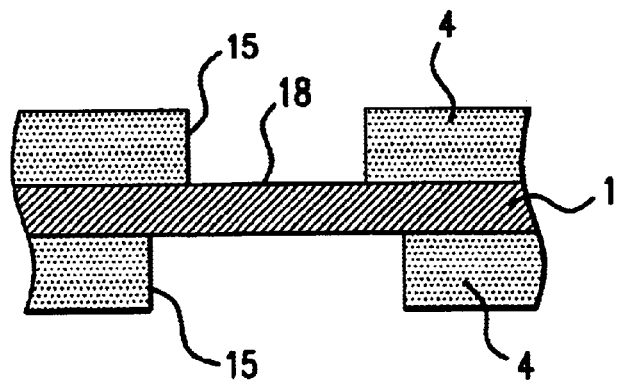
FIGS. 8A–C are views for illustrating the step of cutting the bridges off.
Figure 8B:
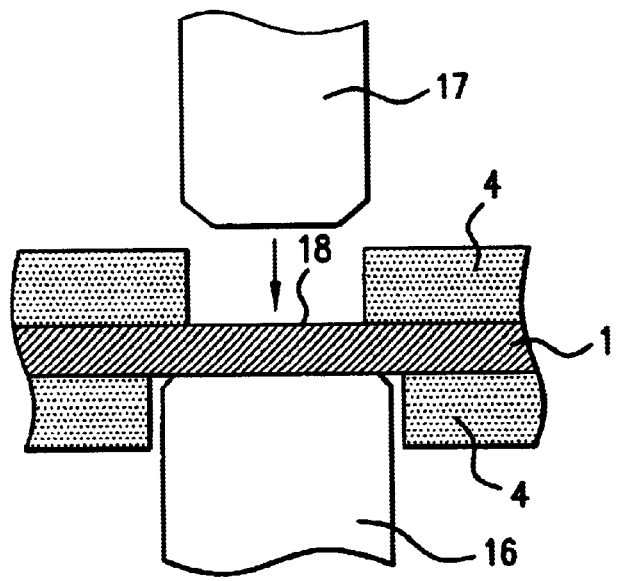
Figure 8C:
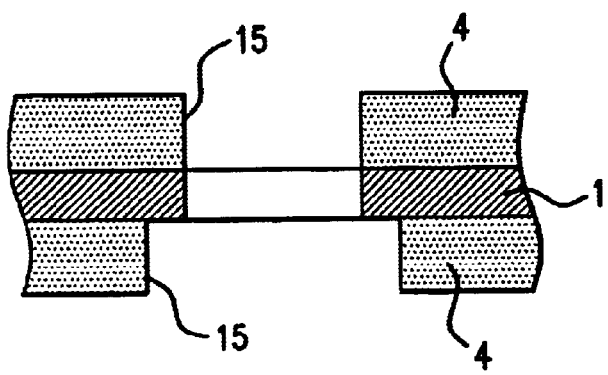

Subsequently, if necessary, the bridge portions 18 coupling the circuits together in the circuit pattern portion 1 are cut off. As shown in FIG. 8A, the covering portion 4 includes openings 15 formed therein at locations corresponding to the bridge portions 18 to be cut. A receiving member 16 is set within a bottom-side opening 15 as shown in FIG. 8B. A circle- or square-shaped punching blade 17 is then urged against the corresponding bridge portion 18 through the top-side opening 15 to sever the bridge portion 18 as shown in FIG. 8C. The receiving member 16 is also used to prevent any deformation in the circuit pattern portion 1 when the bridge portion 18 is cut off. The bridge cutting openings 15 have been formed together with the first and second openings 8, 9 during the molding step.

If necessary, the extensions 11 and support portions 12 can also be cut off by the use of any suitable cutting die.

In such a manner, the electronic parts mounting board will be completed according to the present invention.

Since the circuit pattern portion 1 is punched while at the same time bending the male terminal portions 2, 3 in the method of the present invention, any exclusive bending die for turning the male terminal portions 2, 3 is not required. Furthermore, any special step of bending the male terminal portions 2 and 3 is not also required. As a result, the electronic parts mounting board can inexpensively be manufactured.

Figure 9:
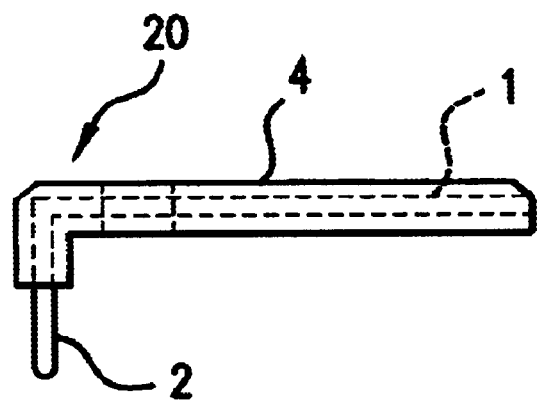
FIG. 9 is a front view of an electronic parts mounting board constructed according to the other embodiment of the present invention.

FIG. 9 is a front view of another embodiment of the present invention. In this embodiment 20, the electronic parts mounting board is of generally L-shaped configuration in which a male terminal portion 2 is only formed in the electronic parts mounting board on one side, as shown in FIG. 9.

FIG. 10 is a plan view of still another embodiment of the present invention. In such a form, fins 30 for radiating heat from the electronic parts 5 are attached to the electronic parts mounting board on the opposite sides relative to the male terminal portions 2, 3. The heat radiating fins 30 are formed as the outermost extensions in the circuit pattern portion 1. Each of the heat radiating fins 30 is formed with a threaded hole 30a used to attach the electronic parts mounting board to any external heat-radiating plate or cooling device. In this connection, the aforementioned extensions 11 may be used as heat radiating fins, without cutting.

Figure 10A:
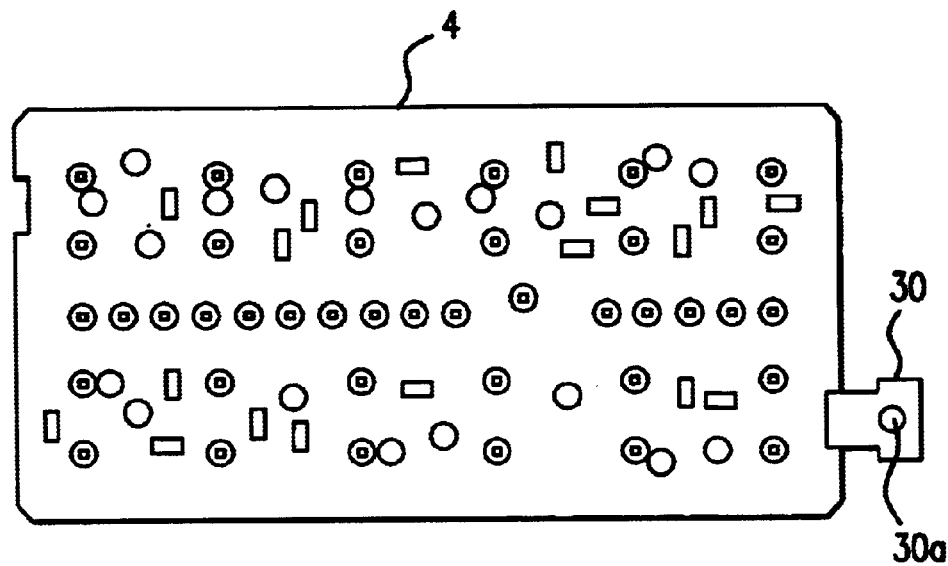
FIGS. 10A and B are plan views for illustrating a further embodiment of the present invention.
Figure 10B:
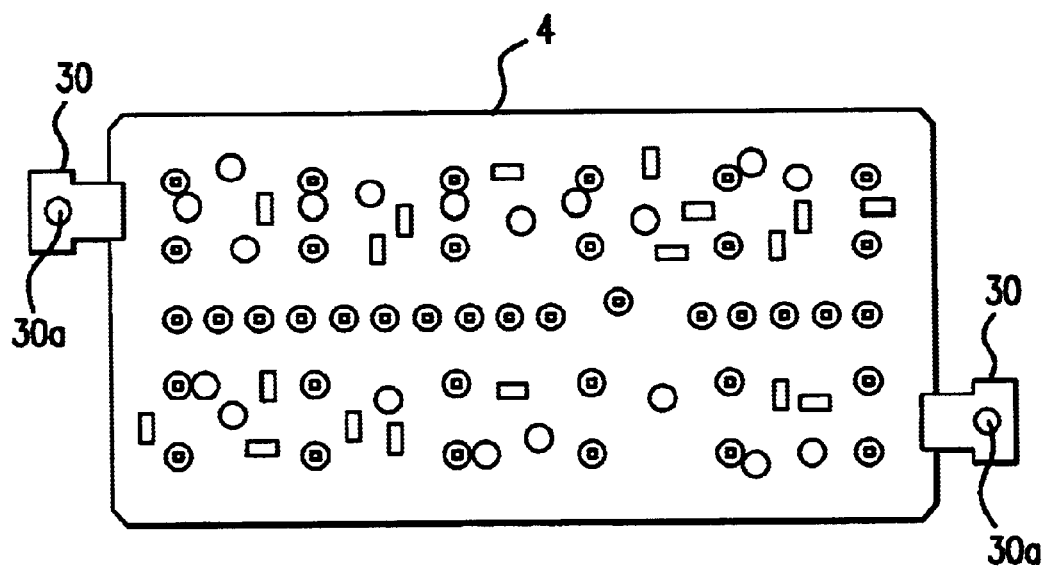
Figure 11:
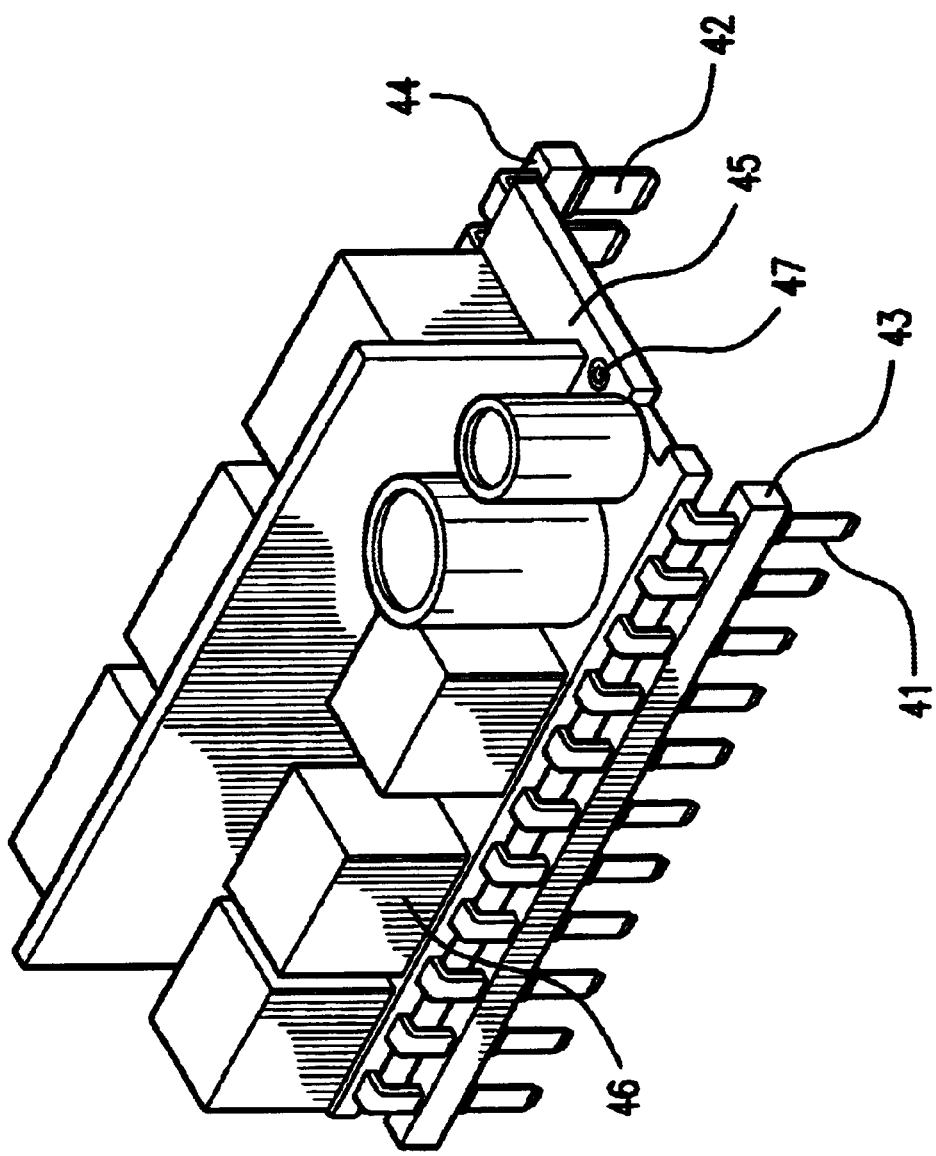
FIG. 11 is a perspective view of an electronic parts mounting board constructed according to the prior art, on which electronic parts are mounted.

A single heat radiating fin 30 may be formed only one side of the electronic parts mounting board (see FIG. 10A) or two heat radiating fins 30 may be formed on both the opposite sides thereof (see FIG. 10B). Alternatively, a plurality of heat radiating fins 30 may be formed only on one side of the electronic parts mounting board.

It is desirable that the circuit pattern portion 1 having the heat radiating fins 30 is a ground, but may be one receiving a heavy-current other than the ground. The heat radiating fins 30 may be covered with resin or not.

The present invention is not limited to the aforementioned forms, but may be carried out in any one of various other forms without departing from the scope of the appended claims. Therefore, the dimensions, configurations, structures and materials of the circuit pattern portion 1, first and second male terminal portions 2, 3, covering portion 4, openings 8, 9 and 15, and heat radiating fins 30 have been exemplified for understanding the present invention and may suitably be changed.

For example, the conductive sheet usable for forming the circuit pattern portion 1 and first and second male terminal portion 2, 3 may be selected from the viewpoint of heat value due to the load current. Thus, the conductive sheet may be made of pure copper other than the brass material, for example. The conductive sheet may be plated, for example, with silver or solder rather than tin. These materials will be selected from the viewpoint of soldering property and reliability.

Although the circuit pattern portion 1 has been described to have its thickness of 0.8 mm, the thickness of the circuit pattern portion 1 may suitably be changed to 0.64 mm, 0.32 mm or others, depending on the load current and application.

Since the covering portion integrally covers the whole circuit pattern portion and base ends of the connector terminal sections in the board of the present invention, the electronic parts mounting board may be improved in the fixation, the alignment and the reinforcement of connector terminal sections.

Since the covering portion also covers the turned or bent parts of the male terminal portions, any leakage due to adhesion of water and the like can be prevented. As a result, the electronic parts mounting board can be improved in reliability.

When the turned parts of the male terminal portions are covered with the covering portion, furthermore, the whole area of the circuit pattern portion can be used as area usable for mounting the electronic parts. This increases the number of electronic parts to be mounted and also decreases the board in size, leading to a reduced manufacturing cost for the electronic parts mounting board.

Since the circuit pattern portion is punched while at the same time bending the male terminal portions in the method of the present invention, any exclusive bending die for turning the male terminal portions is not required. Furthermore, any special step of bending the male terminal portions is not also required. As a result, the electronic parts mounting board can inexpensively be manufactured.

What is claimed is:

1. A method of making electronic parts mounting board comprising a circuit pattern portion and electronic parts mounting through-holes formed by punching a conductive sheet, a connecting terminal portion formed by bending part of the circuit pattern portion and a covering section formed of insulation resin to cover the whole circuit pattern portion and the base end of the terminal portion, said covering section including openings formed therethrough for electrically connecting said circuit pattern portion to electronic parts to be mounted, said method comprising (1) a step of forming an intermediate product using a pressing machine including a progressive die consisting of a stationary die section and a movable die section, said pressing machine being designed to work a longitudinally elongated conductive sheet by inserting said conductive sheet into between said stationary and movable die sections from one direction to the other direction and then moving said movable die section toward said stationary die section, said pressing machine including at least two longitudinally spaced working regions, that is, a first region for punching said conductive sheet to form a circuit pattern and electronic parts mounting through-holes and a second region for bending part of said circuit pattern to form a connecting terminal portion, wherein when said conductive sheet is stopped and if said movable die section is actuated, the conductive sheet is punched at said first region to form the circuit pattern and electronic parts mounting through-holes while at the same time bending, at said second region, part of said circuit pattern to form the connecting terminal portion, said movable die section being upwardly retracted when said conductive sheet is to be delivered in the other direction, whereby desired intermediate products can sequentially be formed by intermittently repeating the stopping and delivering of said conductive sheet in the other direction;

(2) a step of forming an integral covering portion including openings for electrically connecting electronic parts to be mounted with said circuit pattern by molding an insulation resin over the whole top and bottom sides of the circuit pattern and the base portion of the conductive sheet including the bend part of the connecting terminal portion.

2. The method of claim 1, further comprising a step of cutting bridges for connecting the circuit parts of said circuit pattern together.

3. The method of claim 1 wherein said pressing machine included a third region disposed between the first and second regions for swaging the connecting terminal portion formed at the second region into a desired thickness.

4. The method of claim I wherein the desired intermediate product is separated from the conductive sheet at the final region in said pressing machine.

* * * * *